United States Patent [19]
Foo et al.

[11] Patent Number: 6,057,680
[45] Date of Patent: May 2, 2000

[54] METHOD FOR ADJUSTING MR SCAN PLANE OVER CARDIAC CYCLE TO TRACK MOTION OF CORONARY ARTERY

[75] Inventors: Thomas Kwok-Fah Foo, Rockville, Md.; Vincent B. Ho, Fairfax, Va.

[73] Assignee: General Electric Company, Milwaukee, Wis.

[21] Appl. No.: 08/991,820

[22] Filed: Dec. 17, 1997

[51] Int. Cl.[7] ...................................................... G01V 3/00
[52] U.S. Cl. .......................... 324/206; 324/309; 600/595; 600/410
[58] Field of Search ................................. 324/309, 306; 600/595, 407, 410, 419, 500

[56] References Cited

U.S. PATENT DOCUMENTS

| | | | |
|---|---|---|---|
| 4,751,462 | 6/1988 | Glover et al. | 324/309 |
| 4,937,526 | 6/1990 | Ehman et al. | 324/309 |
| 5,277,182 | 1/1994 | Koizumi et al. | 128/653.3 |
| 5,281,916 | 1/1994 | Hinks et al. | 324/309 |
| 5,320,099 | 6/1994 | Roberts et al. | 128/653.3 |
| 5,329,925 | 7/1994 | Nessaiver | 128/653.3 |
| 5,800,354 | 9/1998 | Hofland et al. | 600/410 |

*Primary Examiner*—Christine K. Oda
*Assistant Examiner*—Brij B. Shrivastav
*Attorney, Agent, or Firm*—Skarsten Law Offices S C; Christian G. Cabou; Phyllis Y. Price

[57] ABSTRACT

A method is provided for acquiring MR image data pertaining to a coronary artery which is in motion between end-diastolic and end-systolic maximum excursion positions, respectively, during a cardiac cycle. The method comprises the step of tracking the location of the artery during the cardiac cycle as the artery moves between the positions of maximum excursion. The method further comprises acquiring MR data at a number of locations during the cardiac cycle in a region lying between the maximum excursion positions, each having the excitation or acquisition scan locations adjusted during the MR scan so as to substantially coincide with the location of said artery at the time of data acquisition.

15 Claims, 2 Drawing Sheets

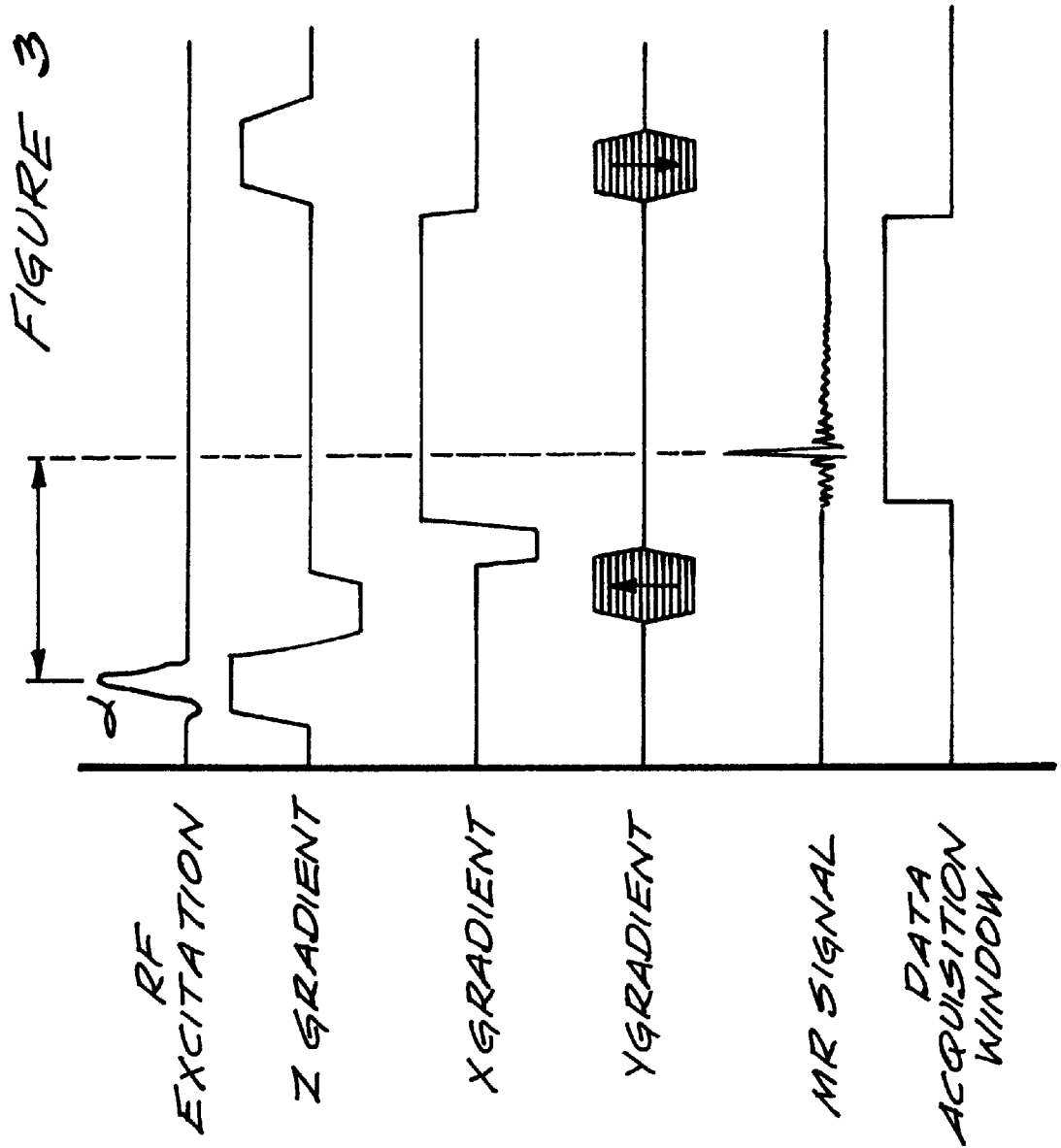

METHOD FOR ADJUSTING MR SCAN PLANE OVER CARDIAC CYCLE TO TRACK MOTION OF CORONARY ARTERY

BACKGROUND OF THE INVENTION

The invention disclosed and claimed herein generally pertains to an improved method for acquiring magnetic resonance (MR) imaging data of a coronary artery, as the artery moves during a cardiac cycle. More particularly, the invention pertains to a method of such type which significantly improves imaging accuracy and efficiency.

As is well known, motion of a coronary artery during a cardiac cycle has two phases or motion components, i.e., motion during systole (mechanical contraction of the heart) and motion during diastole (mechanical relaxation of dilation of the heart). During systole the coronary artery moves from a diastolic position of maximum positional excursion to a systolic position of maximum excursion. During diastole the artery moves from the systolic maximum position back to the diastolic position of maximum excursion.

Because of the continual motion, problems have been encountered in the past, in connection with certain prior art pulse sequences used for MR imaging of coronary arteries. More specifically, when such prior art techniques are employed, the location of the scan plane, that is, the plane in which imaging takes place, may not coincide with the location of the artery. As a result, it becomes necessary to change imaging parameters and acquire further sets of data. Such prior art techniques include acquiring a single image at a single phase of the cardiac cycle; acquiring images at multiple locations, each at a different phase of the cardiac cycle (i.e., single-phase interleaved technique); and acquiring images at a single location but at multiple phases of the cardiac cycle.

For example, in the single image-single phase method, if the timing is off, or if a patient position changes from the time of a preliminary scout scan (used to select the scan plane location) the acquisition will miss the coronary artery. Thus, the scan will have to be repeated, with either a different timing of the scan relative to the cardiac cycle, or at a different scan location.

In regard to the single-phase interleaved method, if the scan locations are incorrectly positioned, or if the scan times are incorrectly estimated, the coronary artery may be missed completely. This is because the pulse sequence used to implement the method acquires an image at different slice locations (in an arrangement using evenly prescribed slice-spacings) and at different times of the cardiac cycle. It is therefore very possible that the coronary artery will not be in the same position or slice location as the excited slice location.

The multi-phase single slice location approach insures that at least one image of the coronary artery will be obtained. However, for tortuous vessels, i.e., those which have a number of kinks or twisted components, or which are otherwise substantially non-coplanar, only a small segment of the coronary artery may be visualized by an image at a sole location. Accordingly, further acquisitions may be needed.

Each of the above techniques requires manual prescription of the scan locations, and relies upon the prerequisite that the vessel is in one of the prescribed scan or slice positions at the appropriate phase of the cardiac cycle. Such techniques may also assume that there is minimal movement during diastole. As descibed above, such methods may miss the coronary artery entirely, or may only capture a segment thereof in one or two images. When this occurs, the scan must be repeated, with a variation of the prescribed slice location, in an effort to visualize a larger vessel segment. Thus, the efficiency of each of the above prior art techniques is comparatively low.

SUMMARY OF THE INVENTION

The invention is directed to automated tracking of a coronary artery as it moves through the cardiac cycle, wherein the slice-selective radiofrequency (rf) pulse frequency offset is adjusted to prospectively follow the artery (i.e., vessel tracking). The tracking of the coronary artery motion can be performed by measuring the maximum excursion of the artery in an orthogonal plane cine scout view, and prospectively estimating the position thereof. By tracking the motion of the artery or other vessel by means of the proposed single-phase multi-slice acquisition, the number of images in which the coronary artery is visualized may be increased.

More particularly, the invention is directed to a method for acquiring MR image data pertaining to a coronary artery which is in motion between end-diastolic and end-systolic maximum excursion positions, respectively, during a cardiac cycle. The method comprises measuring the displacement between the maximum excursion positions, and then generating a function which represents the motion of the artery, from the measured displacement. The method further comprises acquiring MR data at a scan plane which is adjusted during the cardiac cycle to different locations in a region lying between the maximum excursion positions, each of the scan plane locations having an associated time period. The scan plane location associated with a given time period is selected to coincide with the location of the coronary artery at the given time period, as predicted by the artery motion function.

In a preferred embodiment of the invention, wherein the motion of the coronary artery comprises systolic and diastolic motion components during the cardiac cycle, the step of generating the artery motion function includes estimating systolic and diastolic velocities of the coronary artery during systole and diastole, respectively (and estimating the approximate location of the artery as a function of the cardiac phase, i.e., the delay time from the cardiac R-wave trigger). Each of the scan plane locations is associated with an imaging slice in the region between the maximum excursion positions, and the MR data acquisition comprises generating an MR pulse sequence having slice selective radiofrequency (rf) pulses provided with a frequency offset in order to change the excitation slice location. The frequency offset determines the location of the scan plane and its associated imaging slice. The frequency offset of the slice selective radiofrequency (rf) pulse is adjusted so that the scan plane substantially coincides with the artery, as the artery moves between the maximum excursion positions. A cine scout scan is employed to determine the end-diastolic and end-systolic maximum excursion positions. Alternatively, any other suitable MR method may be used to determine such maximum excusion information.

OBJECTS OF THE INVENTION

An object of the invention is to improve efficiency and accuracy in an MR technique for imaging a coronary artery or other vessel, which is in motion during a cardiac cycle.

Another object is to provide an MR imaging technique of the above type, wherein the imaging scan plane automatically tracks or follows the coronary artery as it moves through the cardiac cycle.

Another object is to provide an MR imaging technique of the above type, wherein a mathematical model of vessel motion is employed to steer the imaging scan plane, so that the scan plane is maintained in substantially coincident relationship with the vessel over the cardiac cycle.

These and other objects of the invention will become more readily apparent from the ensuing specification, taken together with the accompanying drawings.

BRIEF DESCRIPTION OF THE DRAWINGS

FIG. 3 is a pulse sequence diagram showing one example of RF and gradient wave forms useful in implementing an embodiment of the invention.

DETAILED DESCRIPTION OF THE PREFERRED EMBODIMENT

Figure 1:
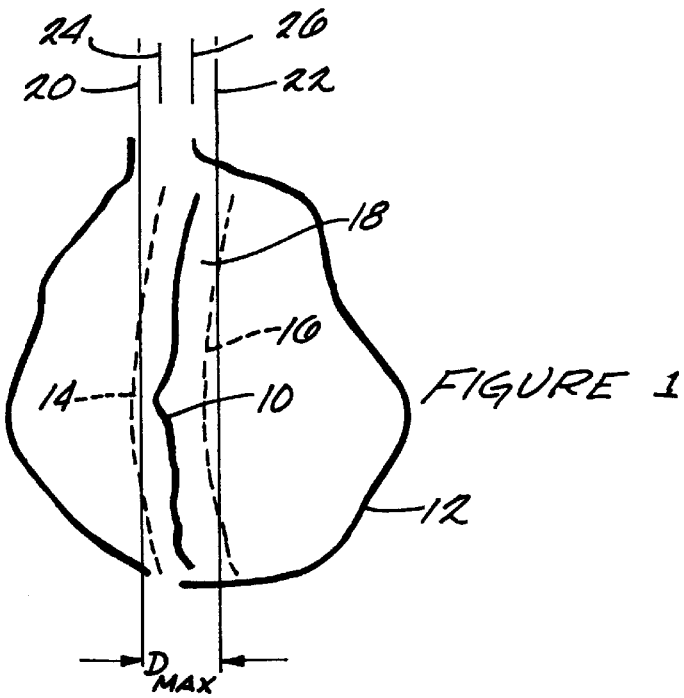
FIG. 1 is a diagram illustrating the maximum excursion positions of a coronary artery.

In accordance with the invention, in order to acquire MR images of a moving coronary artery in a specific scan plane, or plane of acquisition, it must first be prescribed (either graphically or by providing the computer with the location of at least three corner points of the acquisition or scan plane). The prescription of a scan or acquisition plane is customarily performed using a scout scan that is in a plane orthogonal to that of the acquisition or scan plane. From a multi-phase cine acquisition at the same location and rotational orientation as the plane of the scout scan, the motion of the artery or any other vessel in the desired plane of acquisition or scan plane, during the cardiac cycle, can be observed. The maximum excursion or displacement of the vessel during the cardiac cycle, or R—R interval, can then be identified. Referring to FIG. 1, there is shown a representation of such scout image, which depicts a coronary artery 10, such as a right coronary artery, within a heart 12. The artery 10 is located at one extreme position at the beginning of the cardiac cycle, i.e., the diastolic position of maximum excursion or end-diastolic position 14, progresses to the other extreme position, i.e. the systolic position of maximum excursion or end-systolic position 16, and returns to the starting location, i.e., end-diastolic position 14, at the conclusion of the cardiac cycle. The position of the coronary artery 10 is thus constrained to a region 18, lying between the two positions 14 and 16. Accordingly, it is unnecessary to prescribe imaging slice locations beyond the bounds determined by such maximum excursion positions 14 and 16, as observed from the cine scout scan. Moreover, the maximum excursion of the artery 10, i.e., the displacement $D_{max}$ between maximum excursion positions 14 and 16, can be readily determined by simply measuring such displacement on the cine scout image, by means of calipers or the like. The multi-phase scout acquisition will also provide information as to the obliquity of the coronary artery. The scout scan may be carried out, for example, in accordance with an MR sequence which is conventionally available on MR imaging products of the General Electric Company, assignee herein, and which is referred to thereby as a cine scout view sequence. As is known, a cine sequence comprises a time resolved pulse sequence, i.e., a succession of views acquired at the same location but at different times. It will be readily apparent that a number of other MR techniques are available for use in determining the displacement between maximum excursion positions 14 and 16.

Once the region 18, which defines the possible locations of the coronary artery 10, and the maximum displacement $D_{max}$ have been determined, an algorithm can be derived to estimate the position of the coronary artery 10, or other vessel as a function of time or time delay following commencement of the cardiac cycle, or detection of the cardiac electrical R-wave trigger. MR data may be acquired throughout the cardiac cycle, with the slice excitation position adjusted as a function of the time delay of the RF pulse of the MR imaging sequence, likewise from the cardiac R-wave trigger. Thus, the MR scan or image acquisition plane, which corresponds to the position of a slice, can be adjusted or steered to track the location of the coronary artery 10, as the artery moves through the cardiac cycle.

In view of the effort to track the MR data acquisition with the motion of the artery 10, it is desirable to fit as many images as possible into the R—R interval. By using a segmented k-space approach, the maximum number of slice locations that will be acquired can be expressed as:

$$nslices_{\max} = \frac{RR\_time}{vps \times TR + cs\_sattime} \qquad \text{Eqn. (1)}$$

where $nslices_{max}$ is the maximum number of images per R—R interval, vps is the number of views or k-space lines acquired per segment (or per R—R interval), cs_sattime is the time needed to play out a fat suppression pulse, and TR is the sequence repetition time.

Referring further to FIG. 1, there is shown the data acquisition scan plane at a location 20, for a slice taken through end-diastolic position 14 at the beginning of the cardiac cycle. There is further shown the scan plane at a position 22, for a slice taken through the end-systolic position 16. The scan plane is at respective locations 24 and 26 for slices acquired at different locations within region 18. It will be readily apparent that a slice at a given location should be excited at a time during the cardiac cycle such that the coronary artery 10, or at least a substantial portion thereof, will also be at the given location at the time of excitation.

As is well known to those of skill in the art, the motion of a coronary artery is generally different during systole and diastole. The time for systole ($t_{systole}$) is calculated in milliseconds as follows:

$$t_{systole}=546-(2.1 \times HR) \qquad \text{Eqn. (2)}$$

where HR is the heart rate in beats per min. From this expression, the time of diastole ($t_{diastole}$) in milliseconds can be calculated as follows:

$$t_{diastole} = \frac{60,000}{HR} - t_{systole}, \qquad \text{Eqn. (3)}$$

The numerical parameters respectively used in Eqns. (2) and (3) are derived from teachings well known to those of skill in the art. Such a teaching is Bacharach S L, Bonow R O, Green M V, Comparison of fixed and variable temporal resolution methods for creating gated cardiac blood-pool image sequences, J. Nucl. Med. 1990; vol. 31: 38–42. $t_{systole}$ and $t_{diastole}$ are both expressed in milliseconds.

Figure 2:
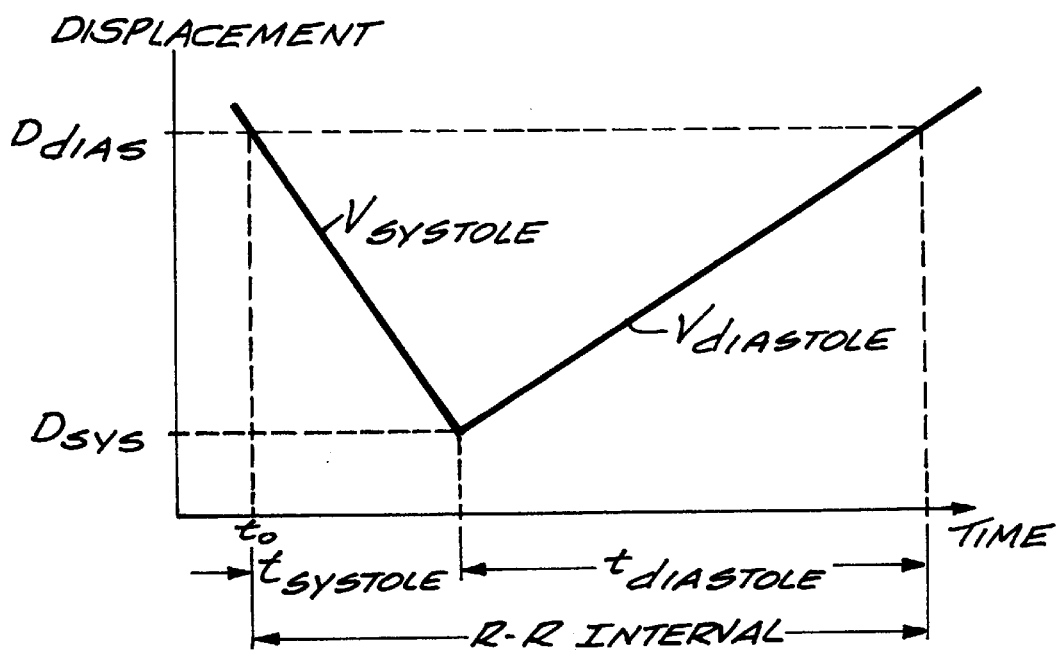
FIG. 2 is a plot or graph of artery displacement versus time, for a linear model of artery motion over the cardiac cycle.

Referring to FIG. 2, there is shown a time-displacement plot or curve, which represents displacement of artery 10 during the R—R interval, as the artery moves between end-diastolic position 14 and end-systolic position 16. It is useful and reasonable to assume a linear model for such motion, so that velocities $v_{systole}$ and $v_{diastole}$, the velocities during systolic and diastolic motion, respectively, can likewise be assumed to be constant. In FIG. 2, $D_{dias}$ indicates the position of coronary artery 10 identified in the scout scan as end-diastolic position 14, and $D_{sys}$ indicates the end-systolic position 16 identified thereby. Artery 10 is at $D_{dias}$ at the beginning of the cardiac cycle, and then moves in systole with a velocity $v_{systole}$ given by the following expression:

$$v_{systole} = \frac{(|D_{sys} - D_{dias}|)}{t_{systole}} \qquad \text{Eqn. (4)}$$

After the artery reaches end-systole position $D_{sys}$, it moves in diastole, in the opposite direction, at a velocity $v_{diastole}$ given by the following expression:

$$v_{diastole} = \frac{(D_{dias} - D_{sys})}{t_{diastole}} \qquad \text{Eqn. (5)}$$

While not shown in FIG. 2, a persistence can be added at end-systole, to account for the fact that the heart stays in the end-systolic position for 30–70 milliseconds.

Having derived a function for artery motion, a related expression may be determined to indicate the location of each of the $nslice_{max}$ imaging slices. Such expression is based on the delay time from the beginning of the R—R interval, that is, from the time $t_0$ shown in FIG. 2. The time of acquisition ($t_{acq}$) of each segment is given by the following expression:

$$t_{acq} = cs\_sattime + \left(\frac{vps}{2} \times TR\right) + i \times (cs\_sattime + (vps \times TR)) \qquad \text{Eqn. (6)}$$

where i is the segment index, $i=0, \ldots, n_{max}-1$, and $n_{max}$ is equal to the maximum number of slices $nslice_{max}$. The time for acquisition is measured at the center of the segment (of vps views). The time of acquisition, $t_{acq}$ is then checked to determine if cardiac motion is in systole or diastole.

The location, or displacement, D(i) of each imaging slice, comprising a function of segment number i, can be related to acquisition time and to the velocity of the artery as follows:

$$D(i) = D_{dias} + (v_{systole} \times t_{acq}), \qquad t_{acq} \leq t_{systole} \qquad \text{Eqn. (7)}$$
$$= D_{sys} + (v_{diastole} \times (t_{acq} - t_{systole})), \quad \text{otherwise.}$$

As stated above, $D_{dias}$ and $D_{sys}$ are the extreme positions of the coronary at diastole and systole, respectively, as measured from the multi-phase cine scout scan, and $v_{systole}$ and $v_{diastole}$ are the systolic and diastolic velocities (indicating speed and direction), respectively.

Referring to FIG. 3, there is shown an MR pulse sequence which may usefully be employed to acquire MR data at respective slice locations D(i), during the cardiac cycle and within region 18. The sequence, known as a fast gradient recalled echo (GRE) sequence, includes a slice selective radiofrequency (rf) pulse and X-, Y-, and Z-gradients, respectively comprising slice-select, read-out, and phase-encoding gradients. The sequence also includes a data acquisition window, during which an MR data signal is received. The location of a slice excited by the sequence of FIG. 3, and of the data acquisition scan plane, is determined by the slice select gradient, which selectively offsets the frequency of the RF pulse. Thus, respective RF frequency offsets are selected in accordance with Eqn. (7), to provide respective imaging slices D(i) as specified thereby.

Clearly, many other MR pulse sequences besides the GRE sequence can be used to acquire MR data at slice locations D(i), as defined by Eqn. (7). The scope of the invention is intended to include all of such sequences.

Obviously, other modifications and variations of the present invention are possible in light of the above teachings. It is therefore to be understood that within the scope of the disclosed concept, the invention may be practiced otherwise than as specifically described.

What is claimed is:

1. A method for acquiring MR image data pertaining to a coronary artery which is in motion between end-diastolic and end-systolic maximum excursion positions, respectively, during a cardiac cycle, said method comprising the steps of:

measuring the displacement between said maximum excursion positions;

generating a function from said measured displacement which represents the motion of said artery during said cardiac cycle;

employing said artery motion function to predict the location of said coronary artery, in a region lying between said maximum excursion positions, at each of a plurality of acquisition times; and acquiring MR data at a scan plane as said scan plane is adjusted during said cardiac cycle to different locations in said region, each of said scan plane locations being associated with one of said acquisition times, the scan plane location associated with a specific acquisition time being selected to coincide with the location of said coronary artery which is predicted by said artery motion function for said specific acquisition time.

2. A method for acquiring MR image data pertaining to a coronary artery which is in motion between end-diastolic and end-systolic maximum excursion positions, respectively, during a cardiac cycle, said motion comprising systolic and diastolic motion components, said method comprising, the steps of:

measuring the displacement between said maximum excursion positions;

generating a function which represents the motion of said artery from said measured displacement and and from estimates of systolic and diastolic velocities of said coronary artery during said systolic and diastolic motion components, respectively; and acquiring MR data at a scan plane, as said scan plane is adjusted during said cardiac cycle to different locations in a region lying between said maximum excursion positions each of said scan plane locations having an associated time within the cardiac cycle as measured from the cardiac R-wave trigger, the scan plane location associated with a specific time being selected to coincide with the location of said coronary artery which is predicted by said artery motion function for said specific time.

3. The method of claim 2 wherein:

each of said scan plane locations is associated with an imaging slice in said region between said maximum excursion positions; and said method includes the step of determining the maximum number of said slices which may be fitted into said cardiac cycle.

4. The method of claim 2 wherein:

said step of acquiring MR data comprises generating an MR pulse sequence having a slice selective radiofrequency (rf) excitation pulse provided with a frequency offset, a given frequency off-set determining a given scan plane location.

5. The method of claim 4 wherein:

said frequency offset of said slice selective radiofrequency (rf) excitation pulse is adjusted so that the location of said scan plane substantially coincides with said artery as said artery moves between said maximum excursion positions.

6. The method of claim 3 wherein:

a selected MR technique is employed to determine said displacement between said maximum excursion positions.

7. The method of claim 6 wherein:

said selected technique comprises a preliminary scout scan.

8. A method for acquiring MR image data pertaining to a coronary artery which is in motion between end-diastolic and end-systolic maximum excursion positions, respectively, during a cardiac cycle, said method comprising the steps of:

generating a function which represents the motion of said artery during said cardiac cycle, within a region lying between said maximum excursion positions; and acquiring MR data at a plurality of slice locations within said region, each slice location having an associated data acquisition time, said slice locations being respectively determined from said artery motion function so that a given slice location substantially coincides with the location of said artery at the data acquisition time associated with said given slice location.

9. The method of claim 8 wherein:

the motion of said coronary artery comprises systolic and diastolic motion components during said cardiac cycle; and said step of generating said artery motion function includes estimating systolic and diastolic velocities of said coronary artery during said systolic and diastolic motion components, respectively.

10. The method of claim 9 wherein:

said method includes the step of determining the maximum number of said slice locations which may be fitted into said cardiac cycle.

11. The method of claim 9 wherein:

said step of acquiring MR data comprises generating an MR pulse sequence having a slice selective radiofrequency (rf) excitation pulse provided with a frequency offset, a given frequency off-set determining a given slice plane location.

12. The method of claim 9 wherein:

said method includes the step of measuring the displacement between said maximum excursion positions.

13. The method of claim 9 wherein:

each of the data acquisition times within the cardiac cycle is measured from the cardiac R-wave trigger.

14. The method of claim 12 wherein:

a selected MR technique is employed to determine said displacement between said maximum excursion positions.

15. The method of claim 14 wherein:

said selected technique comprises a preliminary scout scan.

* * * * *